United States Patent [19]
Horowitz et al.

[11] Patent Number: 5,722,056
[45] Date of Patent: Feb. 24, 1998

[54] RADIO TRANSMITTER WITH POWER AMPLIFIER LINEARIZER

[75] Inventors: Ilan Horowitz, Nes-Ziona; Moshe Ben Ayun; Roni Shamsian, both of Holon; Nachman Grabsky, Ramat Gan; Mark Rozental, Rehovot, all of Israel

[73] Assignee: Motorola, Inc., Schaumburg, Ill.

[21] Appl. No.: 424,298

[22] PCT Filed: Aug. 11, 1994

[86] PCT No.: PCT/IB94/00301

§ 371 Date: Jul. 19, 1995

§ 102(e) Date: Jul. 19, 1995

[87] PCT Pub. No.: WO95/06354

PCT Pub. Date: Mar. 2, 1995

[30] Foreign Application Priority Data

Aug. 20, 1993 [GB] United Kingdom ............... 9317316
Sep. 9, 1993 [GB] United Kingdom ............... 9318694

[51] Int. Cl.[6] ................... H01Q 11/12; H04B 1/04
[52] U.S. Cl. ........................ 435/126; 455/115; 455/127
[58] Field of Search ............................ 455/115, 126, 455/127; 375/297; 330/107, 129, 149

[56] References Cited

U.S. PATENT DOCUMENTS

5,524,285   6/1996   Wray et al. ........................... 455/115
5,584,059  12/1996   Turney et al. ........................ 455/126

*Primary Examiner*—Reinhard J. Eisenzopf
*Assistant Examiner*—Marsha D. Banks-Harold
*Attorney, Agent, or Firm*—Barbara R. Doutre

[57] ABSTRACT

This invention relates to a radio transmitter having a power amplifier and a linearizer arrangement, for example Cartesian feedback, for compensating for non-linearity in the power amplifier. A training signal is applied to the amplifier (36) and the linearizer arrangement is adjusted during a training mode of operation. In one embodiment, a look-up table (23) is provided for storing predetermined operating condition adjustment parameters. According to an operating condition input (e.g. frequency, temperature) control means (21) select operating condition adjustment parameters during the training mode and adjust the training signal to compensate for loop gain variations during the training mode. Automatic gain control (26) may be provided in the amplifier loop for activation during at least a portion of the training mode of operation to maintain constant closed loop gain.

3 Claims, 3 Drawing Sheets

FIG. 1 —PRIOR ART—

RADIO TRANSMITTER WITH POWER AMPLIFIER LINEARIZER

FIELD OF THE INVENTION

This invention relates to a radio transmitter having a power amplifier and a linearizer arrangement for compensating for non-linearity in the power amplifier. An example of such an arrangement is Cartesian feedback with training.

BACKGROUND TO THE INVENTION

Linear transmitters use closed loop techniques to achieve high linearity. The Cartesian feedback loop is a closed loop that includes a nonlinear RF power amplifier (PA). The PA's linearity performance improves proportionally to the loop gain in which the PA is located.

Stability has to be ensured before closing the loop to avoid oscillators and splatter. One method that is used is applying a training signal to the open loop and using a unique method to adjust the loop's phase to be 180 degrees at the summing junction to ensure stability—(see WO-A-9208280).

A RF power amplifier tends to change its phase shift versus output power. Such a PA's AM to PM response reduces the effective phase margin of the loop. The phase adjust should be done at an input level which drives the PA to approximately average output power to maintain a correct phase. Incorrect phase adjust will reduce the effective phase margin and can cause oscillations to occur at peak output power where the PA adds its maximum phase shift.

Forward path gain variations (radio to radio variations, temperature variations and frequency variations) will result in different output powers for the same input level so the phase training will result in incorrect phase adjustment. Moreover, the gain variation that will increase the phase training output power will increase splatter.

In order to maintain the required linearity and good efficiency it is necessary to tune the drive level to be below clip. A method that is used is a training ramp at the baseband input that increases the input until clip is detected by comparing the loop error to a level that indicates clip. The ramp's input level is sampled at the time that clip is detected and the data input level is adjusted to be below clip.

The accuracy of the clip detection by this method and splatter caused while clip is detected depends on the error level before clip. This error level is proportional to loop gain so loop gain variations (typically 10–15 dB vs. temperature and frequency) will influence the detected clip point and splatter.

The problems with known techniques are: (1) additional splatter due to training; (2) over design safety margin:—phase margin and clip to peak power over head ratio.

GB-A-2265270 of Motorola Ltd, published on 22nd Sep. 1993, describes an arrangement which seeks to avoid amplifier training by providing a priori adjustment factors to adjust the loop as far as possible to match the operating conditions, using temperature and frequency look-up tables.

SUMMARY OF THE INVENTION

According to the a first aspect of the present invention, a radio transmitter is provided comprising: a power amplifier; linearizer means coupled to the amplifier for compensating for non-linearity in the power amplifier; feedback means for feeding a signal from an output of the power amplifier to the linearizing means, whereby said amplifier, feedback means and linearizer means form an amplifier loop having a varying loop gain, and training means for applying a training signal to the amplifier and adjusting the linearizer means during a training mode of operation. The arrangement is characterized by: a look-up table for storing predetermined operating condition adjustment parameters and control means having an operating condition input, said control means being coupled to the look-up table for selecting operating condition adjustment parameters according to the operating condition input during the training mode and adjusting the training signal to compensate for loop gain variations during the training mode.

In this manner, more accurate and consistent training can be achieved for varying operating conditions (e.g. temperature and frequency).

The training means preferably comprise switching means for opening and closing the amplifier loop and means for applying a phase training signal to the amplifier when the loop is open, wherein the control means adjust the phase training signal to adjust for open loop gain variations. In this manner, the phase training signal can be adjusted to perform phase training at, for example, a consistent predetermined output power level (e.g. average output power) irrespective of the open loop gain at the operating conditions.

A temperature sensor may be provided and the look-up table may comprise temperature adjustment parameters.

Alternatively or in addition, the operating condition input may comprise a frequency selection input and the look-up table may comprise frequency adjustment parameters, with the control means being responsive to the frequency selection input to select one or more frequency adjustment parameters and to adjust the phase training signal according to the one or more frequency adjustment parameters.

In accordance with a second aspect of the invention, a radio transmitter is provided comprising a power amplifier, linerarizer means coupled to the amplifier for compensating for nonlinearity in the power amplifier, feedback means for feeding a signal from an output of the power amplifier to the linearizer means, whereby the amplifier, feedback means and linearizer means form an amplifier loop having a varying loop again, and training means for applying a training signal to the amplifier and adjusting the linearizer means during a training mode of operation. The invention is characterized by automatic gain control means in the amplifier loop and control means for activating the automatic gain control means during at least a portion of the training mode of operation to maintain constant closed loop gain during that portion and to deactivate the automatic gain control means during a transmit mode of operation.

In a particularly preferred further aspect of the invention, the training means comprise means for applying a gain training signal to the amplifier, wherein the control means adjust the gain training signal.

This feature has the advantage of enabling consistent gain training, for example from a consistent starting level to a consistent clip point. By achieving a consistent clip point, at least two advantages are derived. The amplifier can be designed to be backed off from the clip point by a smaller safety margin, thereby enabling greater efficiency. During amplitude training itself, splatter is unavoidably generated, but the situation can be avoided where the level before clip results in an unnecessarily high clip point and causes excessive splatter.

It is preferably the slope of a portion of linearly increasing amplitude of the gain training signal that is adjusted.

A preferred embodiment of the invention is now described, by way of example only, with reference to the drawings.

DETAILED DESCRIPTION

Figure 1:
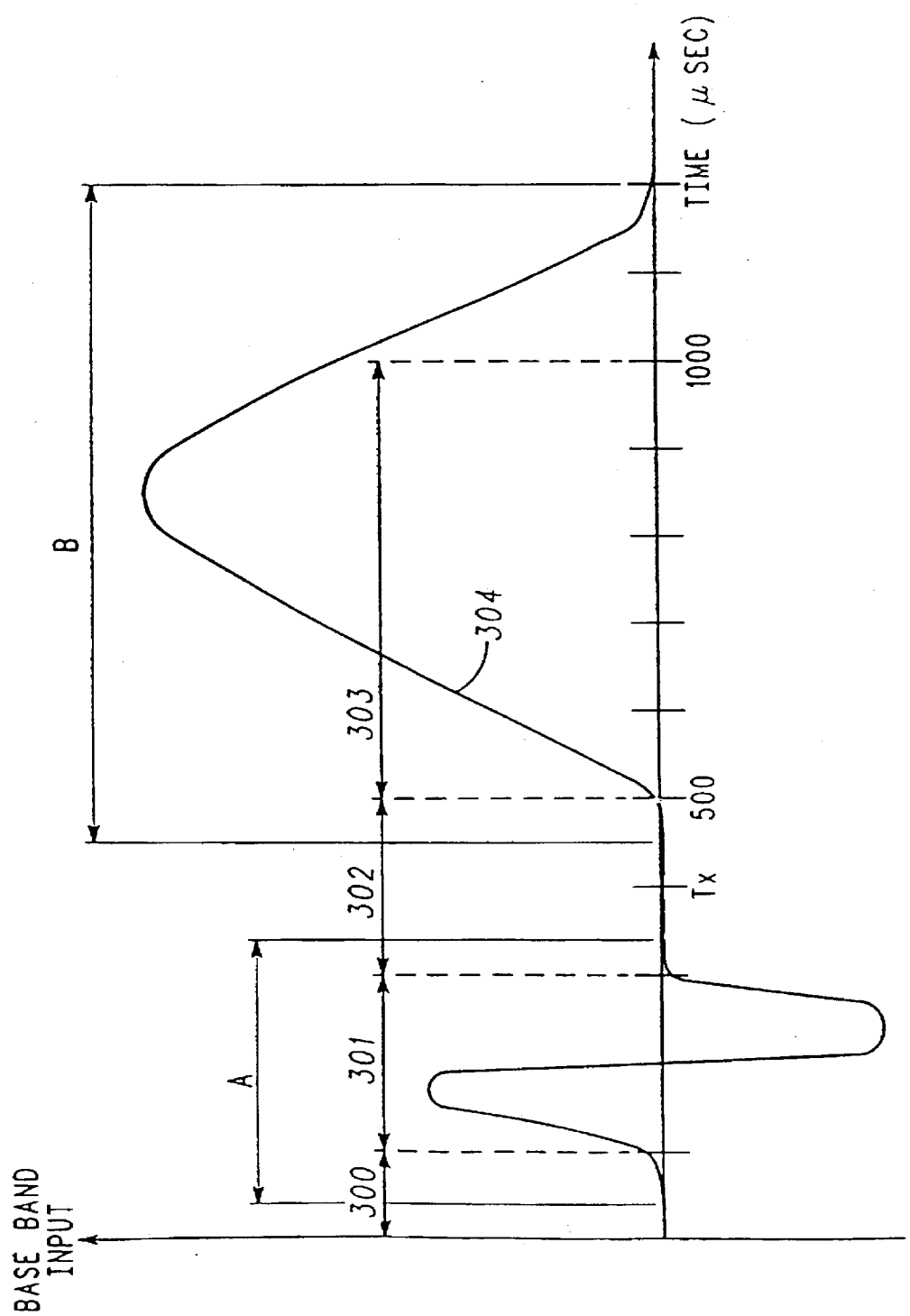
FIG. 1 illustrates a typical training signal.

FIG. 1 shows a training signal that is applied to the input of a Cartesian feedback loop. The training starts with one period of sine wave that is used to adjust the phase. This sine wave is applied to the open loop and the total loop's phase is measured at the feedback input to the summing junction and then adjusted. After the phase has been adjusted the loop is closed at the time point marked by Tx. The second stage of the training is clip detection. A ramp generator is now connected to the input. The input power increases linearly driving the PA towards maximum output power. When the PA starts compressing the error voltage rises and when it reaches the threshold level clip is indicated. The maximum data input level is 2-3 dB below clip level.

Figure 2:
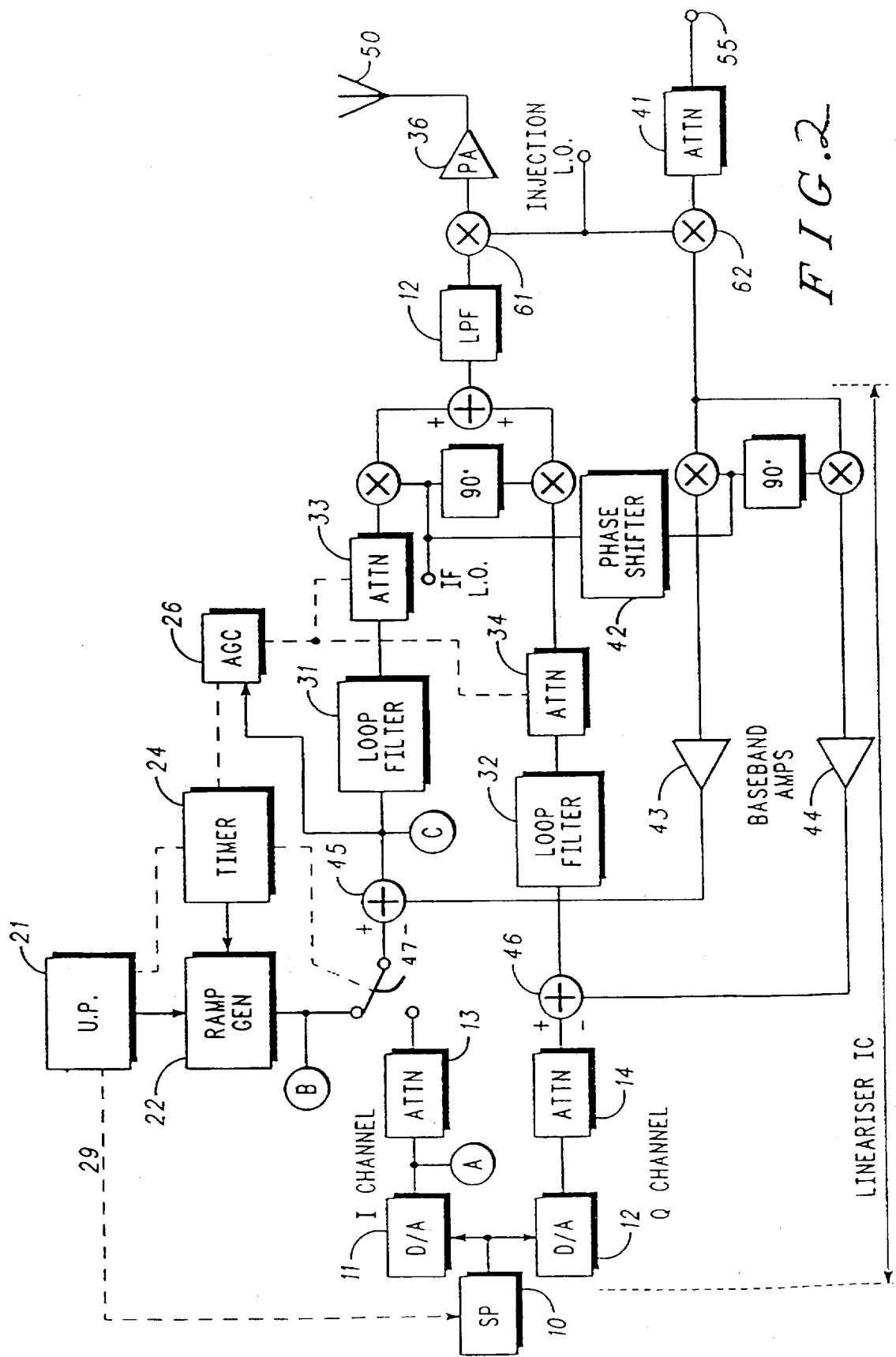
FIG. 2 is a block diagram of a Cartesian feedback loop according to a first embodiment of the invention.

FIG. 2 shows a block diagram of a Cartesian feedback transmitter in accordance with the invention. The radio transmitter comprises a DSP (digital signal processor) 10, a D/A (digital to analog converter) for I channel 11, a D/A for Q channel 12, input attenuation for I channel 13, input attenuation for Q channel 14, a loop filter for I channel 31, a loop filter for Q channel 32, a low pass filter 35, an up converter 61, a power amplifier 36 and an antenna 50. The power amplifier 36 output signal is sampled by the coupler 55 and attenuated by the feedback attenuator 41. The feedback attenuator 41 is connected to a down converter 62 then splits into I and Q and the signal goes to the baseband amplifier for the I channel 43 and to the baseband amplifier for the Q channel 44, closing the loop. The loop has also a microprocessor 21 which senses the temperature via line 29 and updates transmission parameters from a look-up table 23. The microprocessor has a frequency selection input 30 for selecting a desired frequency (e.g. a channel selector). The frequency selection input may be derived in other ways by the microprocessor itself. The microprocessor 21 also controls a ramp generator 22 and a timer 24.

The transmitter is trained before transmitting data. The first step is phase training to adjust the loop's phase to be −180 degrees at the summing junction 45, 46. The loop is then closed and the amplitude training detects the clip point of the power amplifier 36. The data level is adjusted to be 2-3 dB below clip.

On accepting a request for transmission the power amplifier 36 is turned on and the microprocessor sets the transmitter to transmit at open loop i.e. the feedback path is disabled. The microprocessor 21 updates the phase training signal's level from the look-up table 23 according to transmission frequency and temperature. The microprocessor 21 controls the phase training signal's level at the DSP 10. The DSP 10 generates one period of sine wave to the I channel and zero to the Q channel as shown in FIG. 1. The DSP's digital samples are converted to analog signal by the D/A 13 and this passes along the forward path through the power amplifier 36 to the antenna 50. While transmitting the phase training signal the phase around the loop is adjusted by a phase shifter 42 to be −180 deg. at the summing junction to ensure maximum phase margin.

After the loop is closed the microprocessor sets the timer 24 to connect the ramp generator 22 to the loop's input. The ramp generator 22 generates a ramp having a slope which has been updated by the microprocessor 21 according to transmission frequency and temperature.

The input ramp increases output power of the power amplifier 36 linearly. Before the power amplifier 36 comes into compression (starts clipping) the error level (point C) is constant and it is proportional to the loop gain and the ramp's slope. When the power amplifier 36 starts clipping, the error increases rapidly and when it crosses a threshold level this indicates clip and the ramp is sampled. The linearizer then adjusts the input attenuators (for I channel 13 and for Q channel 14) so that the DSP's maximum input level will be 2-3 dB below clip power. The fact that the ramp's slope is controlled by the microprocessor 21 results in an accurate clip detection which will allow lower the overhead ratio and will avoid additional splatter that is caused by the amplitude training.

After the training sequence, the timer 24 connects the input attenuator 13 to the loop's input and the transmitter is ready to transmit data. The microprocessor 21 controls the DSP 10 to start sending data to the transmitter.

Figure 3:
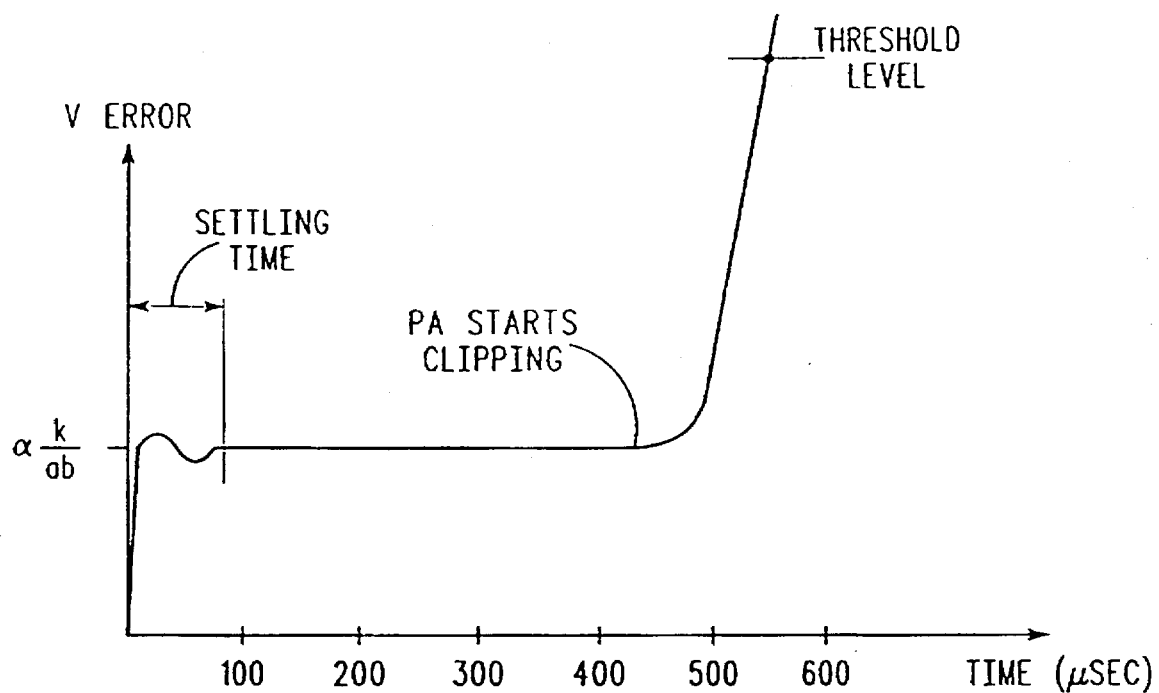
FIG. 3 is a graph showing forward gain vs. temperature for a typical amplifier.

FIG. 3 describes the average forward path's gain variations vs. temperature. This average curve is a result of radios measurements. The gain was measured by applying an input signal that results in average output power (or as close as possible) at all temperature points. A linear interpolation was done between the measured points.

FIG. 4 describes the average forward path's gain variations vs. frequency. This average curve is a result of radios measurements. The gain was measured by applying an input signal that results in average output power (or as close as possible) at all frequencies points. A linear interpolation was done between the measured points.

The following table can be used to adjust the input signal's level against temperature at the phase training stage:

| temp | −30  | −20  | −10  | 0    | 10   | 20   | 30   | 40   | 50   | 60   | 70   |
|------|------|------|------|------|------|------|------|------|------|------|------|
| CF-1 | 0.63 | 0.65 | 0.67 | 0.71 | 0.77 | 0.88 | 1.00 | 1.18 | 1.33 | 1.58 | 1.67 |

*Temperature in deg C.
*C.F. is a correction factor
*Linear interpolation between points The following table can be used to adjust the input signal's level against frequency at the phase training stage:

| freq. | 806  | 809  | 812  | 815  | 818  | 824  | 824  |
|-------|------|------|------|------|------|------|------|
| CF-2  | 0.88 | 0.93 | 0.95 | 1.00 | 1.07 | 1.12 | 1.17 |

*Frequency in MHz
*C.F. is a correction factor
*Linear interpolation between points The phase training signal's amplitude for a unique radio at unique conditions is calculated as follows.

A factory adjustment is made of phase training input level required to result in average output power for the radio in question at nominal conditions (30° C., 815 MHz). An adjustment factor is stored in look-up table 23 e.g. in a non-volatile code plug. This tuning reduces radio-to-radio variations.

The unique adjustment factor is multiplied by CF-1 and by CF-2. The microprocessor 21 updates the DSP 10 with the resulting factor by which it's default phase training signal should be multiplied.

FIG. 5 illustrates the error signal (at point C in FIG. 2) during the amplitude training. After a transition response that takes 50–80 microseconds the error signal is stabilized and stays constant until clip occurs. The error level before clip is about 20–30 mV. This level is directly proportional to the ramp's slope and opposite to the loop gain. When the PA starts clipping the error increases rapidly. The exact clip point is detected by comparing the error level to threshold that represent clip (approx. 754 mV).

FIG. 6 shows loop gain variations vs. temperature. It shows upper and lower limits. All radios will be between these lines. The curves are relative to 30 deg. C. since the radios are tuned in the factory at 30 deg. C. The curves have been derived empirically.

The following table can be used to change the ramp's slope against temperature during amplitude training:

This method will reduce 15–20 dB of forward gain variations to 3–4 dB variations maintaining correct phase adjust, maximum phase margin and reduce additional splatter.

The third step involves changing the ramp's slope relative to loop gain in order to minimize error voltage variations caused by loop gain variations. The procedure will improve clip detection accuracy and will reduce splatter. The third step uses a modified amplitude training signal that changes the ramp's slope in proportion to loop gain to maintain constant error level before clip.

By way of explanation of the observation that ramp slope, loop gain and error are proportionally related, the following mathematical analysis in Laplace plane is given (referring to FIG. 2).

$AB(s)=ab/s$ (before clip); ab is the loop gain and the input is a ramp that is modeled by (at point B):

$Vinput\ (s)=K/s^2$ K is the ramp's slope

The error voltage will be then (at point C);

$Verror=Vinput*1/(1+AB)$ $Vinput/(AB)$ when $AB>>1$

Assigning $AB=abt/s$ and $Vinput=k/s^2$ will give:

$Verror=k/ab*1/s$ (before clip)

| temp | −30 | −20 | −10 | 0 | 10 | 20 | 30 | 40 | 50 | 60 | 70 |
|---|---|---|---|---|---|---|---|---|---|---|---|
| Kr | 2.31 | 2.00 | 1.77 | 1.58 | 1.41 | 1.26 | 1.00 | 0.79 | 0.71 | 0.63 | 0.56 |

Temperature is in degrees Centigrade. Kr is a correction factor. Linear interpolation is carried out between points.

The ramp's slope for a unique radio at unique condition is calculated by multiplying the radio's unique tuning factors (previously obtained by the ramp's slope calibration process) by Kr. The microprocessor 21 updates the ramp generator 22 with the slope appropriate to the operating temperature.

In summary a method has been described for accurate and consistent amplifier training. The method comprises three major steps: (1) factory adjustment of the phase training input level to result in average output power for each radio at nominal conditions, the adjustment result being stored in the radio's code plug. This tuning will reduce radio to radio variations; (2) adjustment of open loop gain during phase training according to pro-stored operating condition adjustment factors and (3) adjustment of closed loop gain during amplitude training according to prestored operating condition adjustment factors.

The second step involves a two-part procedure. Firstly, the radio's forward path gain variations vs. temperature (FIG. 3) are characterized and a look-up table is created to change the phase training signal's level vs. temperature every 10 deg C. The look-up table can also be based on predetermined factors and/or equations and/or a characterizing equation.

Secondly, the radio's forward path gain variations vs. frequency (FIG. 4) are characterized and a look-up table is created to change the phase training signal's level vs. frequency at five different frequencies. Again the look-up table can be based on predetermined factors and/or equations and/or a characterizing equation.

Linear interpolation is carried out between the characterized points in each case.

We can see that the error (at point C) will step up and it's level will be directly proportional to the ramp's slope (k) and opposite to the loop gain (ab).

The third step comprises two elements:

Firstly the radio's loop gain variations vs. temperature (FIG. 6) are characterised and a look-up table is created to change the ramp's slope vs. Temperature every 10 deg C. The look-up table can also be based on predetermined factors and/or equations and/or a characterizing equation. Linear interpolation is performed between the characterized points.

Secondly the loop gain variations vs. frequency are characterized and a look-up table is created to change the phase training signal's level vs. frequency at five frequencies.

The look-up table can also be based on predetermined factors and/or equations and/or a characterizing equation. It is also possible to do the tuning procedure in the factory at five RF frequencies and to store the five tuning results in the radio's code plug.

Linear interpolation is again performed between the characterized points.

This algorithm will reduce 10–15 dB of loop gain variations to 4 dB variation at the error signal maintaining accurate clip detection and reduce additional splatter.

Referring to FIG. 7, a further embodiment of the invention is shown. In this figure, elements already described with reference to FIG. 2 have the same reference numerals. FIG. 7 shows a block diagram of a Cartesian feedback transmitter similar to that of FIG. 2 but modified so as to include AGC circuitry. The timer 24 controls an AGC block 25 which senses the error voltage and controls the loop attenuators (for I & Q channels 33 & 34). The AGC block 25 contains the dynamics to control the AGC loop.

The transmitter is trained as described with reference to the circuit of FIG. 2 and after the loop is closed the microprocessor sets the timer 24 to connect the ramp generator 22 to the loop's input.

While the input starts ramping the error steps up and it settles after a settling time of 50–80 microseconds as shown in FIG. 5. After 100–150 microseconds, the AGC circuitry is activated to adjust the error level to be 25 mV by changing the loop attenuators 33 & 34. The attenuators should be set within 150–200 microseconds and then frozen until the next training. The attenuations of the loop attenuators 33 & 34 are again updated at the next training period.

The input ramp increases output power of the power amplifier 36. When the power amplifier 36 starts clipping the error increases rapidly and when it crosses the threshold level that indicates clip, the ramp is sampled. The linearizer then adjusts the input attenuators (for I channel 13 and for Q channel 14) so that maximum input level of the DSP 10 is 2–3 dB below the sampled level of the ramp. This ensures that the data's output power will be 2–3 dB below clip power.

The fact that the loop gain is adjusted before the clip is detected ensures an accurate clip detection which will allow lower overhead ratio (i.e. safety margin) and will avoid additional splatter that is caused by the amplitude training.

After the training sequence, the timer 24 connects the input attenuator 13 to the loop's input and the transmitter is ready to transmit data. The microprocessor 21 controls the DSP 10 to start sending data to the transmitter. The transmitter will operate at optimal stability conditions and the constant loop gain, achieved by the AGC operation, will result in constant adjacent splatter.

The AGC circuitry should be located at the forward path after the main noise source and before it degrades the forward path's linearity (FIG. 7). It should be able to maintain 20 dB of AGC (6 dB radio to radio variations, 3 dB flatness and 10 dB for temperature variations). The dynamics inside the AGC block 25 (zeros, poles and gain) are dependent on location of the attenuators 33 and 34 in the forward path.

The attenuation selected by the AGC will be activated at the phase training stage as well as at the transmitting time.

Thus the AGC will keep the error level constant maintaining constant radio performance.

The arrangement makes use of the observation that the error signal is inversely proportional to the loop gain. This observation is used by the AGC circuit 26 to measure the error signal and adjust the attenuation in the loop to maintain constant and consistent loop gain.

We claim:

1. A radio transmitter comprising:

a power amplifier;

linearizer means coupled to the amplifier for compensating for nonlinearity in the power amplifier;

feedback means for feeding a signal from an output of the power amplifier to the linearizer means, whereby said amplifier, feedback means and linearizer means form an amplifier loop having a varying loop gain;

training means for applying a training signal to the amplifier and adjusting the linearizer means during a training mode of operation, characterized by:

automatic gain control means in said amplifier loop; and control means for activating said automatic gain control means during at least a portion of said training mode of operation to maintain constant closed loop gain during said portion and to deactivate said automatic gain control means during a transmit mode of operation.

2. A transmitter according to claim 1, wherein the training means comprise means for applying a gain training signal to the amplifier during a gain training portion of said training mode, wherein the control means are arranged to activate said automatic gain control means during said gain training portion.

3. A transmitter according to claim 2, wherein the gain training signal has a linear portion of linearly increasing amplitude and the control means are arranged to activate said automatic gain control means during said linear portion.

* * * * *